United States Patent
Yoshioka et al.

(10) Patent No.: US 10,073,128 B2
(45) Date of Patent: Sep. 11, 2018

(54) LEAK DETECTION DEVICE

(71) Applicant: Hitachi Automotive Systems, Ltd., Hitachinaka-shi, Ibaraki (JP)

(72) Inventors: Yuji Yoshioka, Hitachinaka (JP); Tsuyoshi Kai, Hitachinaka (JP); Akihiko Kudo, Hitachinaka (JP); Masahiro Ueda, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 881 days.

(21) Appl. No.: 14/409,184

(22) PCT Filed: Dec. 28, 2012

(86) PCT No.: PCT/JP2012/084147
§ 371 (c)(1),
(2) Date: Dec. 18, 2014

(87) PCT Pub. No.: WO2013/190733
PCT Pub. Date: Dec. 27, 2013

(65) Prior Publication Data
US 2015/0168474 A1    Jun. 18, 2015

(30) Foreign Application Priority Data

Jun. 18, 2012  (WO) ................ PCT/JP2012/065478

(51) Int. Cl.
*G01R 31/02*  (2006.01)
*B60L 3/00*   (2006.01)
(Continued)

(52) U.S. Cl.
CPC .......... *G01R 31/025* (2013.01); *B60L 3/0069* (2013.01); *B60L 3/04* (2013.01);
(Continued)

(58) Field of Classification Search
CPC .. G01R 31/025; G01R 31/02; G01R 31/3644; B60L 3/0069; B60L 3/04; B60L 7/14;
(Continued)

(56) References Cited

U.S. PATENT DOCUMENTS 4,893,085 A * 1/1990 Taruya ................ F02P 17/12
                                                    324/160
6,778,913 B2   8/2004 Tinnemeyer
(Continued)

FOREIGN PATENT DOCUMENTS

JP       60-183565 A    9/1985
JP     2005-189005 A    7/2005
(Continued)

OTHER PUBLICATIONS

The Extended European Search Report dated Mar. 8, 2016 in the EP Application No. 12879186.0.

*Primary Examiner* — Yoshihisa Ishizuka
(74) *Attorney, Agent, or Firm* — Volpe and Koenig, P.C.

(57) ABSTRACT

A leak detection device includes a pulse signal outputting portion that outputs predetermined pulse signals to a positive connecting wire connected to a positive side of a battery and a negative connecting wire connected to a negative side of the battery. A response waveform detecting portion of the leak detection device detects a positive response waveform for the pulse signal output to the positive connecting wire and a negative response waveform for the pulse signal output to the negative connecting wire. An amplitude ratio calculating portion calculates an amplitude ratio based on the positive response waveform and the negative response waveform, and a leak detecting portion detects a leak between the battery and a ground based on the amplitude ratio.

13 Claims, 14 Drawing Sheets

(51) Int. Cl.
*B60L 3/04* (2006.01)
*B60L 7/14* (2006.01)
*B60L 11/18* (2006.01)
*G01R 31/36* (2006.01)

(52) U.S. Cl.
CPC .............. *B60L 7/14* (2013.01); *B60L 11/1803* (2013.01); *B60L 11/1864* (2013.01); *G01R 31/02* (2013.01); *G01R 31/3644* (2013.01); *B60L 2270/20* (2013.01); *Y02T 10/7005* (2013.01); *Y02T 10/7061* (2013.01)

(58) Field of Classification Search
CPC .............. B60L 11/1803; B60L 11/1864; B60L 2270/20; Y02T 10/7005; Y02T 10/7061
USPC ............................................................ 702/58
See application file for complete search history.

(56) References Cited

U.S. PATENT DOCUMENTS

| 2004/0243288 | A1 | 12/2004 | Kito et al. |
| 2007/0008666 | A1 | 1/2007 | Morita et al. |
| 2011/0215793 | A1* | 9/2011 | Emoto ................ G01D 1/00 324/76.11 |
| 2011/0313613 | A1* | 12/2011 | Kawahara ........ H01M 10/441 701/34.4 |
| 2012/0043967 | A1 | 2/2012 | Miura et al. |

FOREIGN PATENT DOCUMENTS

| JP | 2006-145293 A | 6/2006 | |
| JP | 2010-019603 A | 1/2010 | |
| JP | WO 2010109956 A1 * | 9/2010 | ......... H01M 10/441 |
| JP | 2010-249766 A | 11/2010 | |

* cited by examiner

[FIG. 1]
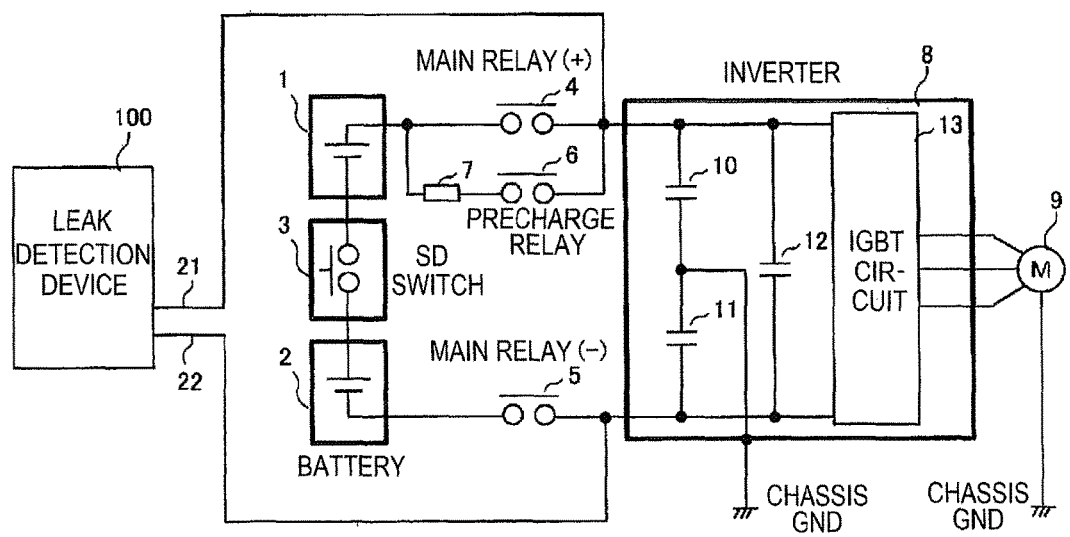

[FIG. 2]
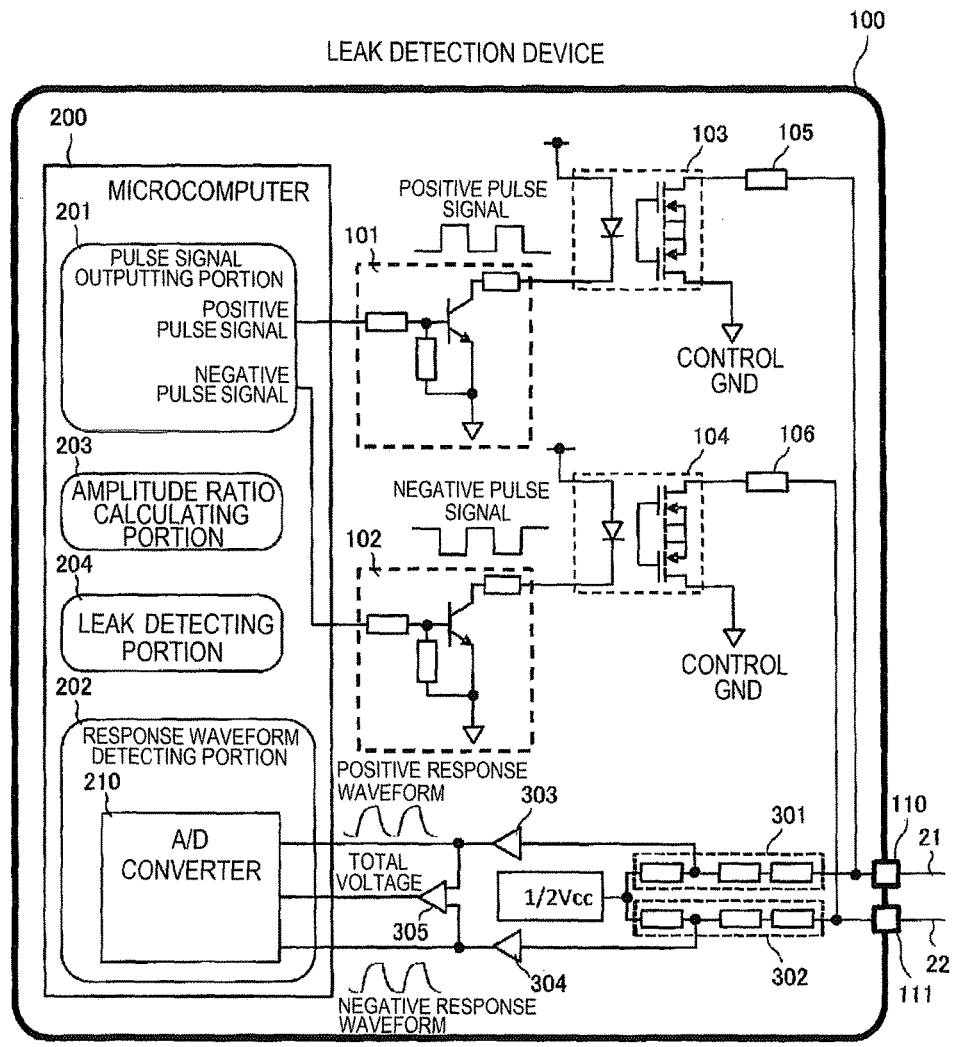

[FIG. 3]
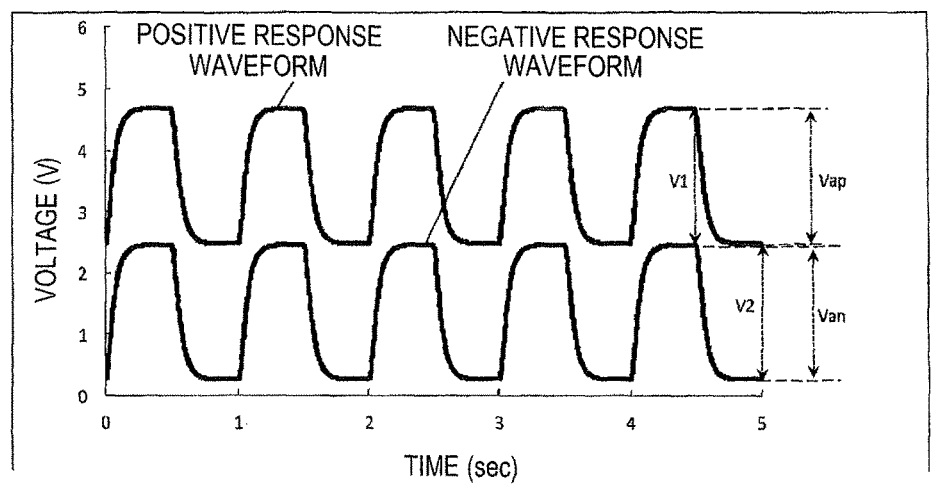

[FIG. 4]
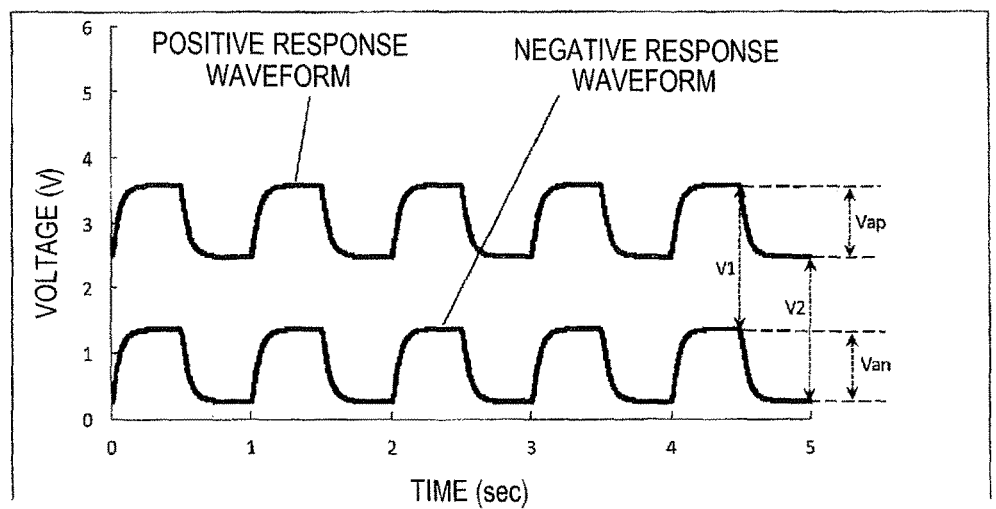

[FIG. 5]
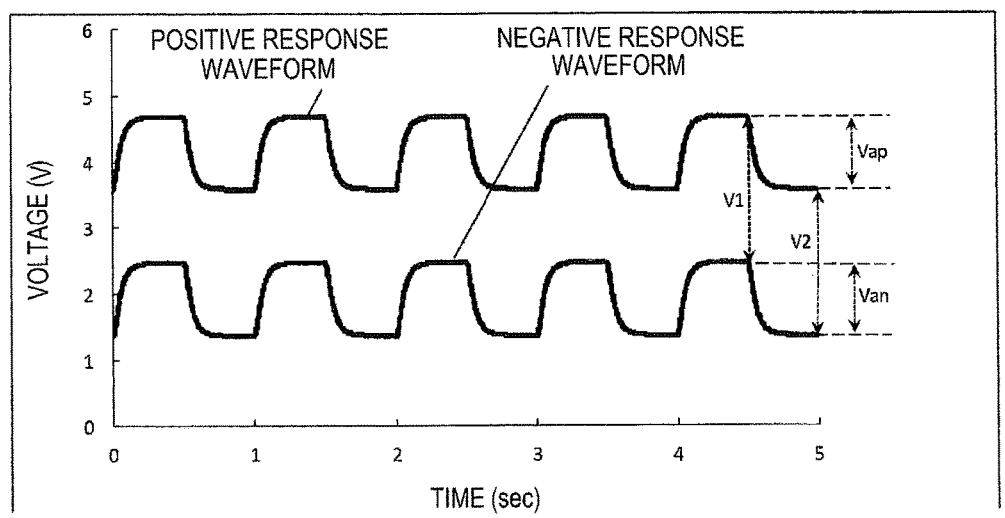

[FIG. 6]
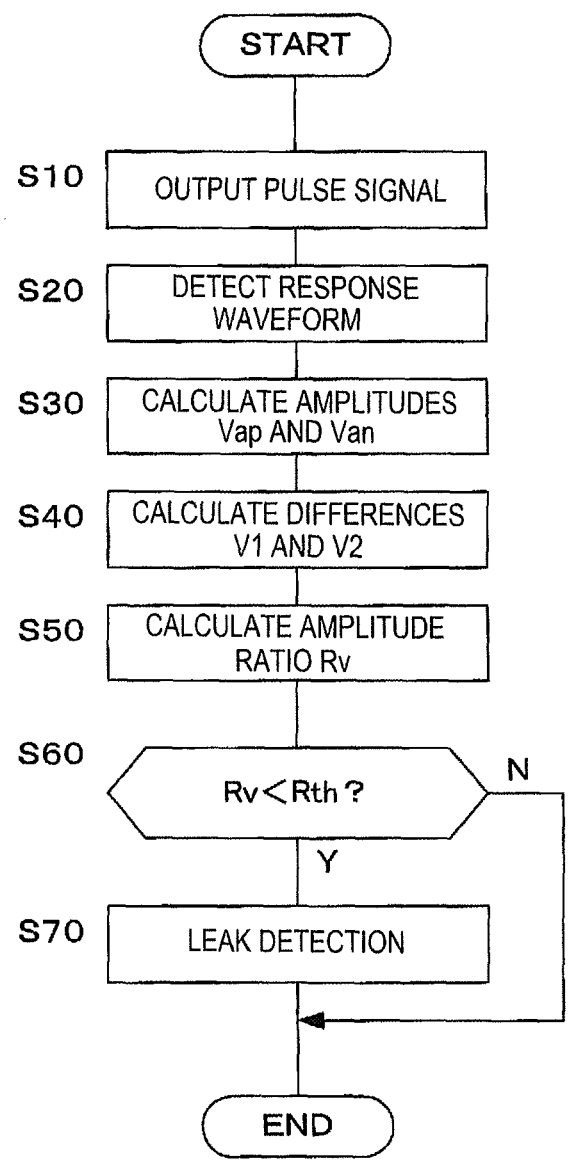

[FIG. 7]
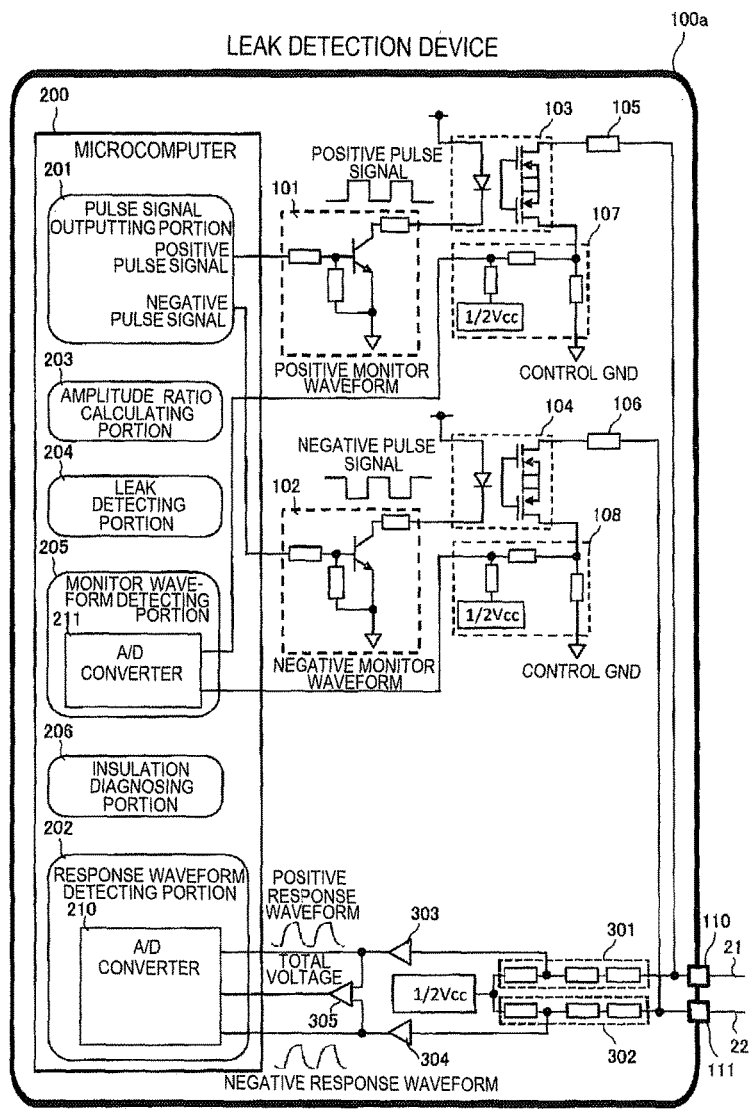

[FIG. 8]
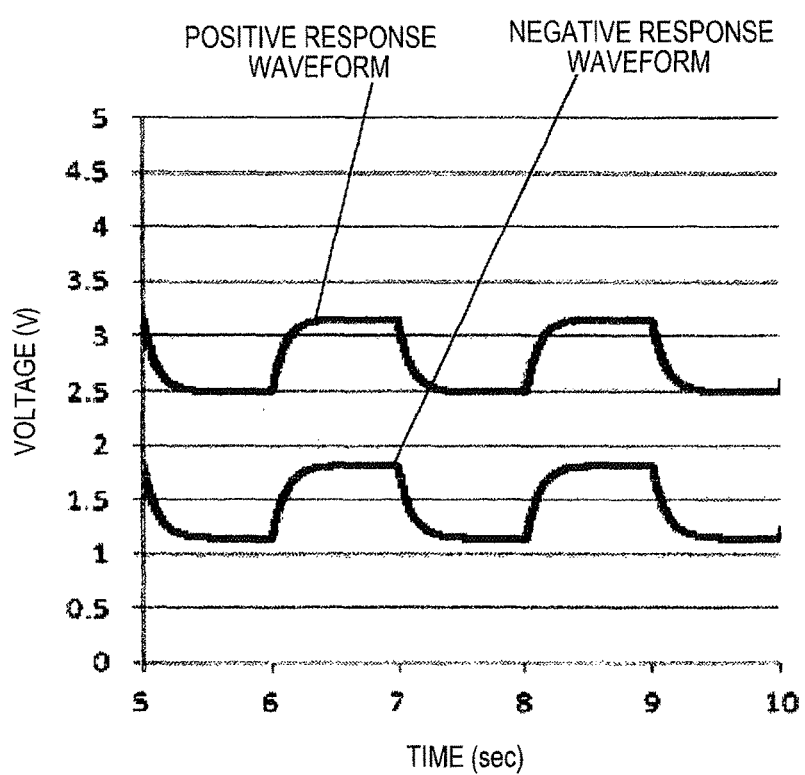

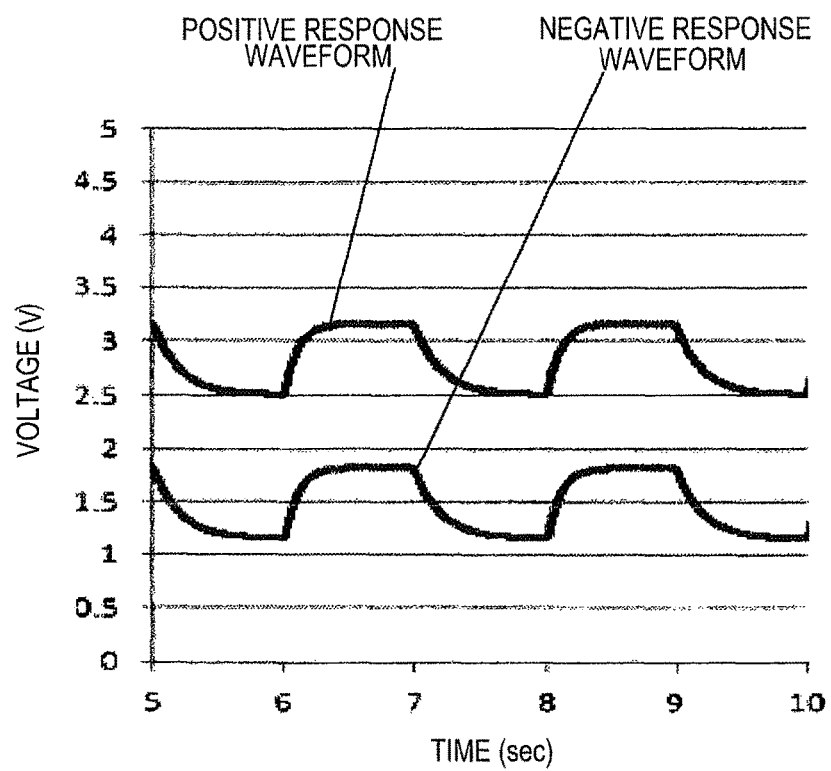
[FIG. 9]

[FIG. 10]
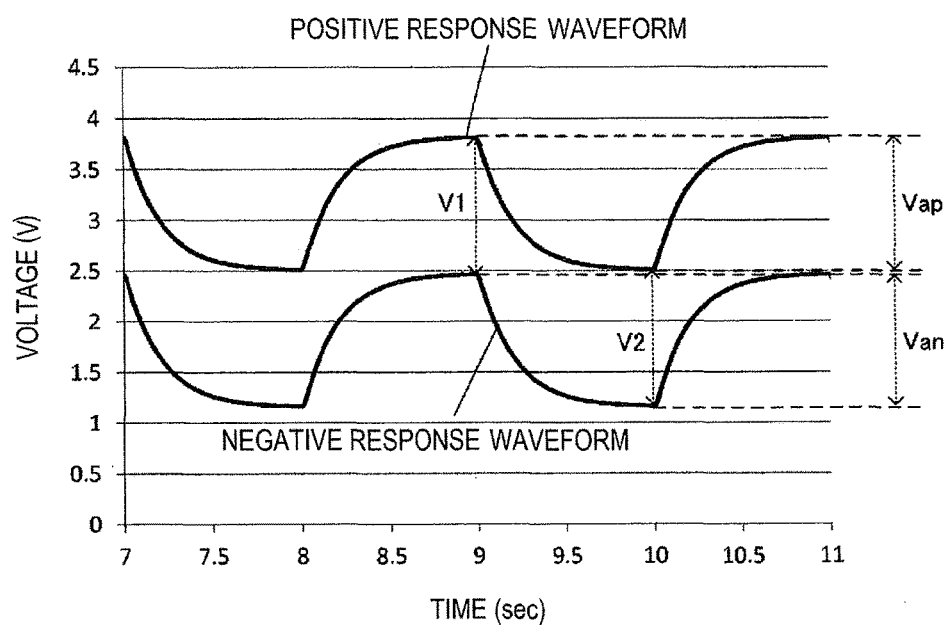

[FIG. 11]
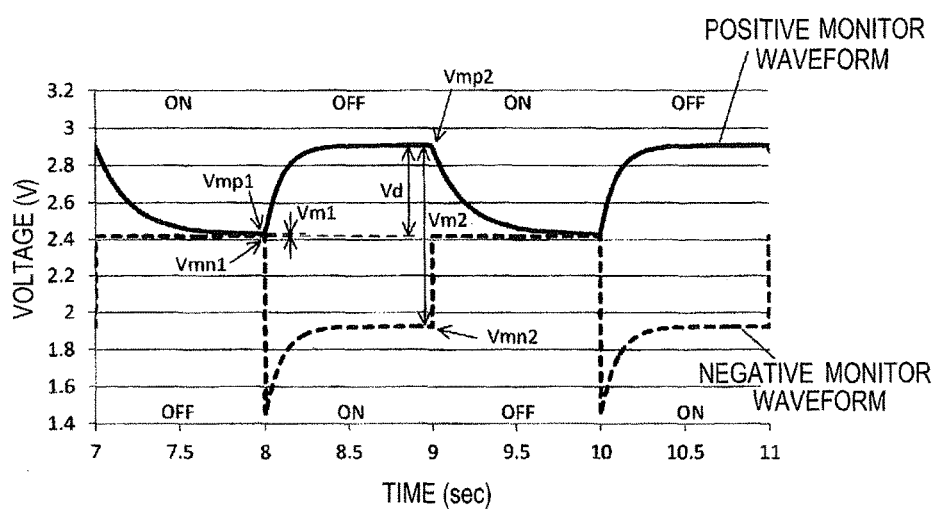

[FIG. 12]
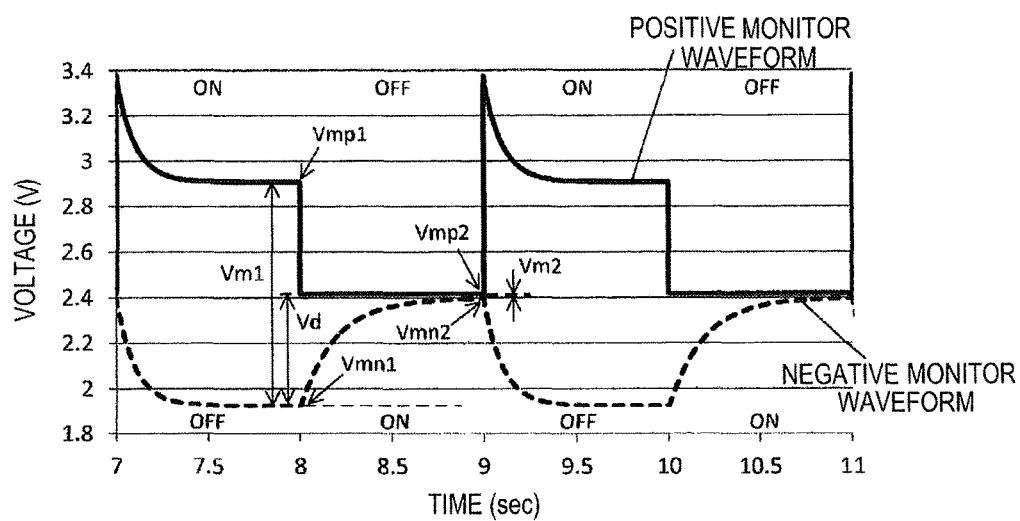

[FIG. 13]
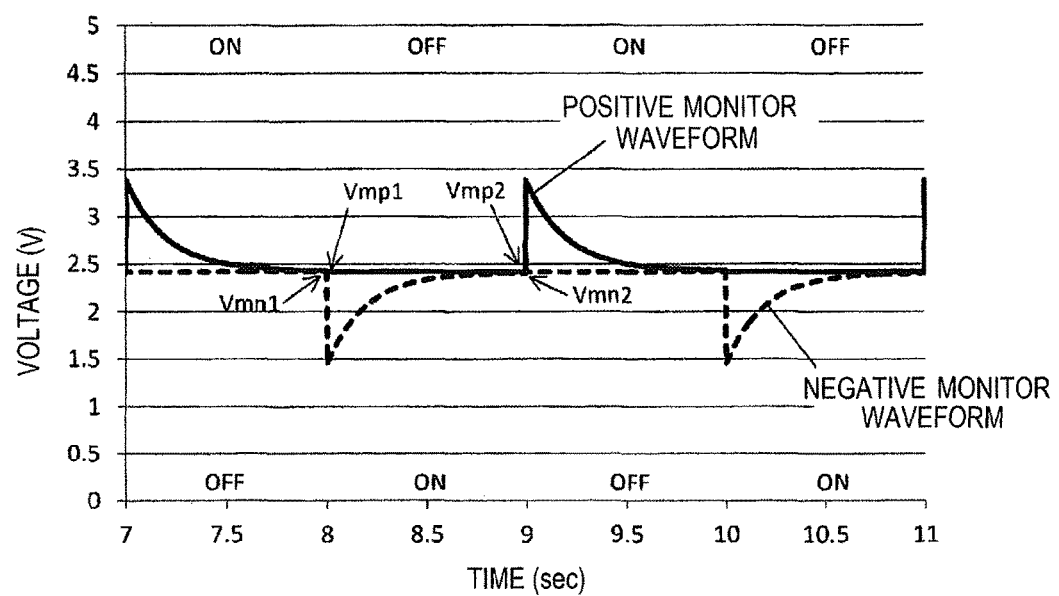

[FIG. 14]
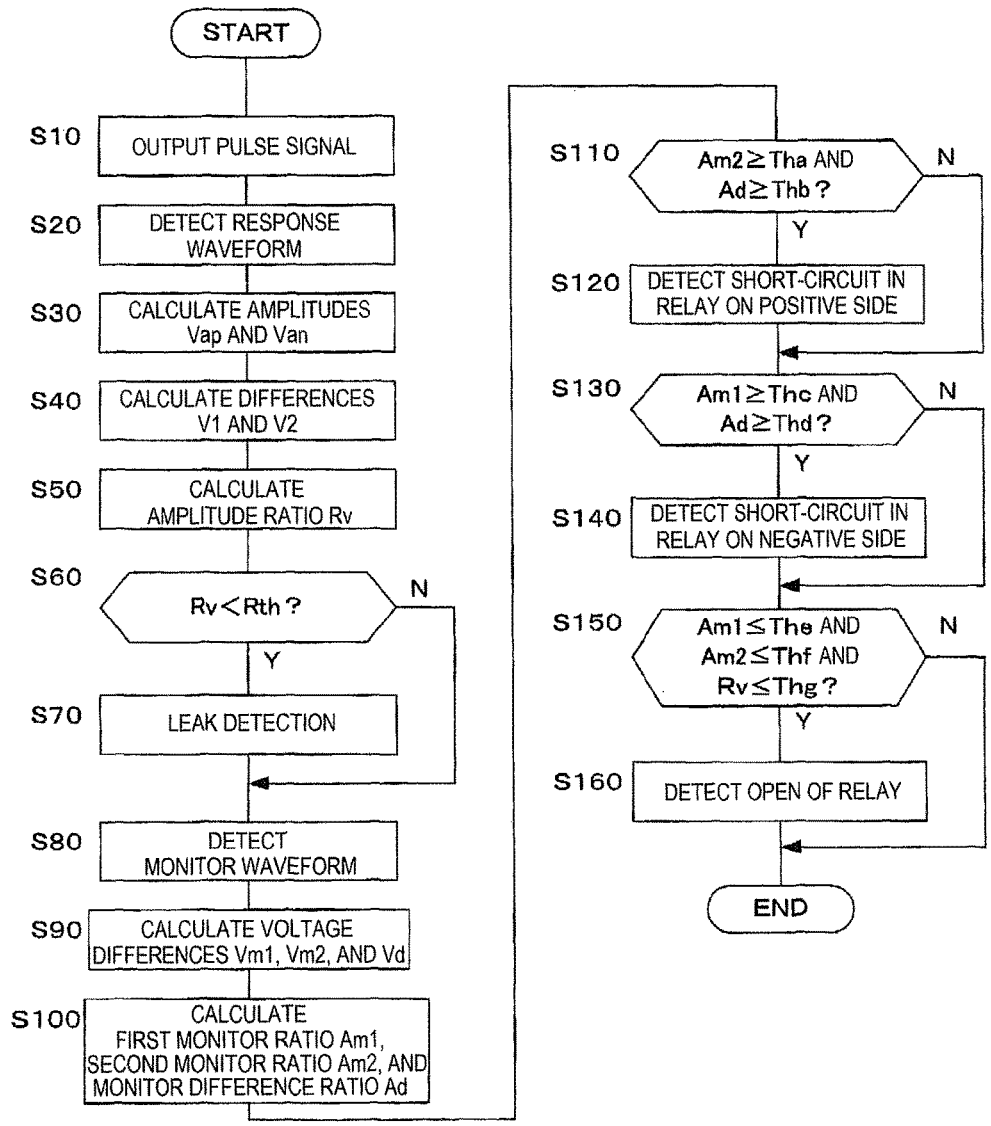

LEAK DETECTION DEVICE

TECHNICAL FIELD

The present invention relates to leak detection devices.

BACKGROUND ART

A battery and a power supply device which are installed in an electric car and so forth are insulated from a car body and other circuits to prevent an electric shock. For such insulation for the battery and the power supply device, in the past, a leak detection device that detects leakage (a leak) caused by insufficient insulation has been proposed. In PTL 1, a technique of detecting the presence or absence of a leak by varying a portion of a resistance value of insulation resistance between a battery using an assembled battery and a ground and detecting the insulation resistance at this time has been disclosed.

CITATION LIST

Patent Literature

PTL 1: JP-A-2010-19603

SUMMARY OF INVENTION

Technical Problem

In the exiting technique described in PTL 1 mentioned above, variations in a battery voltage at the time of actual use are not expected. Therefore, if the battery voltage varies due to the operation of an inverter or the like, it becomes sometimes difficult to detect the presence or absence of a leak correctly.

Solution to Problem

A leak detection device according to an aspect of the present invention is a device detecting a leak between a battery and a ground and includes: a pulse signal outputting portion that outputs predetermined pulse signals to a positive connecting wire connected to a positive side of the battery and a negative connecting wire connected to a negative side of the battery; a response waveform detecting portion that detects a positive response waveform for the pulse signal output to the positive connecting wire and a negative response waveform for the pulse signal output to the negative connecting wire; an amplitude ratio calculating portion that calculates an amplitude ratio based on the positive response waveform and the negative response waveform; and a leak detecting portion that detects a leak between the battery and the ground based on the amplitude ratio.

A leak detection device according to another aspect of the present invention is a device detecting a leak between a battery and a ground and includes: a pulse signal outputting portion that outputs predetermined pulse signals to a positive connecting wire connected to a positive side of the battery and a negative connecting wire connected to a negative side of the battery; insulating circuits that provide insulation between the positive connecting wire and the pulse signal outputting portion and between the negative connecting wire and the pulse signal outputting portion; a response waveform detecting portion that detects a positive response waveform for the pulse signal output to the positive connecting wire from the pulse signal outputting portion via the insulating circuit and a negative response waveform for the pulse signal output to the negative connecting wire from the pulse signal outputting portion via the insulating circuit; a leak detecting portion that detects a leak between the battery and the ground based on the positive response waveform and the negative response waveform; a monitor waveform detecting portion that detects, as a positive monitor waveform and a negative monitor waveform, output voltage waveforms of the insulating circuits observed when the pulse signals are output to the positive connecting wire and the negative connecting wire from the pulse signal outputting portion; and an insulation diagnosing portion that makes a diagnosis of states of the insulating circuits based on the positive monitor waveform and the negative monitor waveform.

Advantageous Effects of Invention

According to the present invention, it is possible to detect the presence or absence of a leak even when a battery voltage varies.

BRIEF DESCRIPTION OF DRAWINGS

FIG. 1 is a diagram depicting the configuration of a power supply device including a leak detection device according to an embodiment of the present invention.

FIG. 2 is a diagram depicting the configuration of a leak detection device according to a first embodiment of the present invention.

FIG. 3 is a diagram depicting an example of a response waveform observed when no leak occurs.

FIG. 4 is a diagram depicting an example of a response waveform observed when a leak occurs on the positive side.

FIG. 5 is a diagram depicting an example of a response waveform observed when a leak occurs on the negative side.

FIG. 6 is a flowchart depicting the flow of leak detection processing.

FIG. 7 is a diagram depicting the configuration of a leak detection device according to a second embodiment of the present invention.

FIG. 8 is a diagram depicting an example of a response waveform observed when a leak occurs on the positive side in a normal state of a PhotoMOS relay.

FIG. 9 is a diagram depicting an example of a response waveform observed when no leak occurs in a short-circuit state of the PhotoMOS relay.

FIG. 10 is a diagram depicting an example of a response waveform observed when no leak occurs in a normal state of the PhotoMOS relay.

FIG. 11 is a diagram depicting an example of a monitor waveform observed when the PhotoMOS relay on the positive side is short-circuited.

FIG. 12 is a diagram depicting an example of a monitor waveform observed when the PhotoMOS relay on the negative side is short-circuited.

FIG. 13 is a diagram depicting an example of a monitor waveform observed when the PhotoMOS relays are normal.

FIG. 14 is a flowchart depicting the flow of leak and relay state detection processing.

DESCRIPTION OF EMBODIMENTS (First Embodiment)

Hereinafter, an embodiment of the present invention will be described by using the drawings. FIG. 1 is a diagram depicting the configuration of a power supply device including a leak detection device according to the embodiment of the present invention. This power supply device is used by being installed in a vehicle, for example. The power supply device of FIG. 1 is connected to a motor 9 and includes batteries 1 and 2, a service disconnect (SD) switch 3, main relays 4 and 5, a precharge relay 6, a precharge resistor 7, an inverter 8, and a leak detection device 100.

The batteries 1 and 2 generate direct-current power for driving the motor 9 and supply the direct-current power to the inverter 8. Furthermore, regenerated power generated by operating the motor 9 as a generator may be stored in the batteries 1 and 2. For example, each of the batteries 1 and 2 can be configured by connecting a plurality of battery cells using a lithium-ion battery or the like. The battery 1 and the battery 2 are connected to each other via the SD switch 3 for maintenance and inspection. At the time of maintenance and inspection, in order to prevent an operator from getting an electric shock, a connection between the battery 1 and the battery 2 is disconnected by opening the SD switch 3.

The batteries 1 and 2 and the inverter 8 are connected via the main relays 4 and 5 and the precharge relay 6. The opening and closing states of the main relays 4 and 5 and the precharge relay 6 are individually controlled by an unillustrated control device. Between the battery 1 and the precharge relay 6, the precharge resistor 7 is provided. At the start of passage of electric current through the inverter 8 from the batteries 1 and 2, as a result of the main relay 5 and the precharge relay 6 being first closed, the batteries 1 and 2 and the inverter 8 are connected via the precharge resistor 7. As a result, an inrush current flowing into the inverter 8 from the batteries 1 and 2 is limited, and contacts of the main relays 4 and 5 and the precharge relay 6 are protected. Thereafter, as a result of the main relay 4 being closed and the precharge relay 6 being opened, the batteries 1 and 2 and the inverter 8 are connected without the precharge resistor 7. As a result of the opening and closing of the main relays 4 and 5 and the precharge relay 6 being controlled in this way, the connection state of the batteries 1 and 2 and the inverter 8 is switched.

The inverter 8 has capacitors 10, 11, and 12 for removing noise and smoothing a current and an IGBT circuit 13. The IGBT circuit 13 incorporates a plurality of IGBTs (insulated-gate bipolar transistors) as switching elements. The switching operation of each IGBT is controlled by the unillustrated control device. As a result, the direct-current power supplied from the batteries 1 and 2 is converted into alternating-current power and is output to the motor 9. Moreover, alternating-current regenerated power generated by the motor 9 is converted into direct-current power and is stored in the batteries 1 and 2.

The leak detection device 100 is a device for detecting a leak between the batteries 1 and 2 and a chassis ground. The leak detection device 100 is connected between the batteries 1 and 2 and the inverter 8 via a positive connecting wire 21 connected to the positive sides of the batteries 1 and 2 and a negative connecting wire 22 connected to the negative sides of the batteries 1 and 2.

FIG. 2 is a diagram depicting the configuration of the leak detection device 100 according to the embodiment of the present invention. The leak detection device 100 includes transistor circuits 101 and 102, PhotoMOS relays 103 and 104, leak resistors 105 and 106, a microcomputer 200, voltage-dividing resistor portions 301 and 302, operational amplifiers 303 and 304, and a differential amplifier 305. The leak resistors 105 and 106 and the voltage-dividing resistor portions 301 and 302 are respectively connected to the positive connecting wire 21 and the negative connecting wire 22 via connectors 110 and 111.

The microcomputer 200 functionally has a pulse signal outputting portion 201, a response waveform detecting portion 202, an amplitude ratio calculating portion 203, and a leak detecting portion 204. The microcomputer 200 can implement the functions corresponding to these portions by executing predetermined programs previously stored in unillustrated memory.

The pulse signal outputting portion 201 outputs predetermined pulse signals, as a positive pulse signal and a negative pulse signal, respectively, to the transistor circuits 101 and 102 each being formed by using a transistor and a plurality of resistor elements. The transistor circuits 101 and 102 pass predetermined operating currents through light-emitting diodes provided on the input sides of the PhotoMOS relays 103 and 104, respectively, in accordance with the periods in which these pulse signals are ON (H level).

The PhotoMOS relays 103 and 104 each have a light-emitting diode on the input side and a PhotoMOSFET on the output side, and electrical insulation is provided between them. The input sides of the PhotoMOS relays 103 and 104 are connected to the pulse signal outputting portion 201 of the microcomputer 200 via the transistor circuits 101 and 102. The output sides of the PhotoMOS relays 103 and 104 are connected to the positive connecting wire 21 and the negative connecting wire 22, respectively, via the leak resistors 105 and 106 and the connectors 110 and 111, respectively. That is, in the leak detection device 100, the PhotoMOS relays 103 and 104 respectively function as insulating circuits that provide insulation between the positive connecting wire 21 and the pulse signal outputting portion 201 and between the negative connecting wire 22 and the pulse signal outputting portion 201.

As described earlier, when the positive pulse signal and the negative pulse signal are output from the pulse signal outputting portion 201 to the transistor circuits 101 and 102, the operating currents corresponding to these pulse signals flow through the light-emitting diodes of the PhotoMOS relays 103 and 104. When the light-emitting diodes on the input sides of the PhotoMOS relays 103 and 104 intermittently emit light by these operating currents, the PhotoMOSFETs on the output sides switch the connection states between the leak resistors 105 and 106 and a control ground in response to the light-emitting timing. As a result, the positive connecting wire 21 and the negative connecting wire 22 are intermittently connected to the control ground via the leak resistors 105 and 106. By such operations, the pulse signal outputting portion 201 can output the positive pulse signal and the negative pulse signal to the positive connecting wire 21 and the negative connecting wire 22, respectively, via the transistor circuits 101 and 102, the PhotoMOS relays 103 and 104, and the leak resistors 105 and 106, respectively.

When the positive pulse signal is output from the pulse signal outputting portion 201 to the positive connecting wire 21 in the manner described above, voltage variations in accordance with the positive pulse signal occur in the positive connecting wire 21. The waveform of the voltage variations (the positive response waveform) varies depending on insulation resistance between the positive sides of the batteries 1 and 2 and the chassis ground. Likewise, when the negative pulse signal is output from the pulse signal outputting portion 201 to the negative connecting wire 22, voltage variations in accordance with the negative pulse signal occur in the negative connecting wire 22. The waveform of the voltage variations (the negative response waveform) varies depending on insulation resistance between the negative sides of the batteries 1 and 2 and the chassis ground.

The positive response waveform in the positive connecting wire 21 and the negative response waveform in the negative connecting wire 22 are input to the response waveform detecting portion 202 of the microcomputer 200 via the voltage-dividing resistor portions 301 and 302 and the operational amplifiers 303 and 304, respectively. At this time, by dividing the voltage of the positive connecting wire 21 and the voltage of the negative connecting wire 22 by the voltage-dividing resistor portions 301 and 302, respectively, these voltages are made to be within the operating ranges of the operational amplifiers 303 and 304. Furthermore, by appropriately selecting the resistance values of the voltage-dividing resistor portions 301 and 302, both the positive response waveform and the negative response waveform which are input to the microcomputer 200 via the operational amplifiers 303 and 304 are made to fall within the input voltage range of the microcomputer 200. Incidentally, the voltage between the voltage-dividing resistor portion 301 and the voltage-dividing resistor portion 302 is set so as to be ½ of a Vcc voltage which is the upper limit of the input voltage range set for the microcomputer 200.

The response waveform detecting portion 202 incorporates an A/D converter 210 and, by using the A/D converter 210, takes in the positive response waveform and the negative response waveform input via the voltage-dividing resistor portions 301 and 302 and the operational amplifiers 303 and 304, respectively, as digital values. As a result, it is possible to detect the positive response waveform and the negative response waveform in the response waveform detecting portion 202. Furthermore, the response waveform detecting portion 202 can also detect the total voltage of the batteries 1 and 2 by taking in the difference between the positive response waveform and the negative response waveform which is output from the differential amplifier 305, that is, the voltage between the positive connecting wire 21 and the negative connecting wire 22 by using the A/D converter 210.

The amplitude ratio calculating portion 203 calculates an amplitude ratio in accordance with the leak state between the batteries 1 and 2 and the chassis ground based on the positive response waveform and the negative response waveform detected by the response waveform detecting portion 202. The leak detecting portion 204 detects a leak between the batteries 1 and 2 and the chassis ground based on the amplitude ratio calculated by the amplitude ratio calculating portion 203. Incidentally, a method for calculating the amplitude ratio by the amplitude ratio calculating portion 203 and a method for detecting a leak by the leak detecting portion 204 will be described in detail later.

Next, an example of a response waveform which is detected by the response waveform detecting portion 202 will be described. FIG. 3 is a diagram depicting an example of a response waveform observed during normal operation, that is, when no leak occurs. On the other hand, FIGS. 4 and 5 depict examples of response waveforms observed during abnormal operation, that is, when a leak occurs. FIG. 4 is a diagram depicting an example of a response waveform observed when a leak occurs on the positive side, and FIG. 5 is a diagram depicting an example of a response waveform observed when a leak occurs on the negative side. Here, examples of response waveforms observed when pulse signals each repeating ON (H level) and OFF (L level) every 0.5 minute are output to the positive connecting wire 21 and the negative connecting wire 22 as the positive pulse signal and the negative pulse signal, respectively, from the pulse signal outputting portion 201.

In the response waveforms of FIGS. 3 to 5, an upper waveform indicates a positive response waveform, and a lower waveform indicates a negative response waveform. Moreover, the amplitude of the positive response waveform is represented as Vap, and the amplitude of the negative response waveform is represented as Van. Furthermore, the difference between the maximal value (maximum value) of the positive response waveform and the maximal value (maximum value) of the negative response waveform is represented as V1, and the difference between the minimal value (minimum value) of the positive response waveform and the minimal value (minimum value) of the negative response waveform is represented as V2.

A comparison of the response waveforms of FIGS. 3 to 5 reveals that, as compared to the response waveform of FIG. 3 observed when no leak occurs, in the response waveforms of FIGS. 4 and 5 observed when a leak occurs, the amplitude Vap of the positive response waveform and the amplitude Van of the negative response waveform are decreased. On the other hand, as for the differences V1 and V2 described above, no change is observed between the response waveform of FIG. 3 observed when no leak occurs and the response waveforms of FIGS. 4 and 5 observed when a leak occurs. That is, when a leak occurs, only the amplitude changes in the positive response waveform and the negative response waveform, and the difference between them, that is, the potential difference between the positive connecting wire 21 and the negative connecting wire 22 does not change.

The amplitude ratio calculating portion 203 calculates an amplitude ratio Rv by the following expression (1) based on the amplitude Vap of the positive response waveform and the amplitude Van of the negative response waveform depicted in the response waveforms of FIGS. 3 to 5 and the differences V1 and V2. The calculated amplitude ratio Rv is sent to the leak detecting portion 204 from the amplitude ratio calculating portion 203.

$$Rv=(Vap+Van)/(V1+V2) \qquad (1)$$

Here, as described earlier, when a leak occurs, the amplitude Vap of the positive response waveform and the amplitude Van of the negative response waveform are decreased as compared to those observed when no leak occurs. On the other hand, the differences V1 and V2 do not change. Therefore, it turns out that the amplitude ratio Rv calculated by the above-described expression (1) changes in response to the leak state between the batteries 1 and 2 and the chassis ground and becomes a smaller value when a leak occurs as compared to that observed during normal operation. By using this, it is possible to sense the presence or absence of a leak between the batteries 1 and 2 and the chassis ground based on the value of the amplitude ratio Rv in the leak detecting portion 204.

FIG. 6 is a flowchart depicting the flow of leak detection processing which is performed in the microcomputer 200 when the presence or absence of a leak is detected in the above-described manner.

In step S10, the microcomputer 200 outputs, by the pulse signal outputting portion 201, predetermined pulse signals as a positive pulse signal and a negative pulse signal. The positive pulse signal output from the pulse signal outputting portion 201 is output to the positive connecting wire 21 via the transistor circuit 101, the PhotoMOS relay 103, and the leak resistor 105. Moreover, the negative pulse signal output from the pulse signal outputting portion 201 is output to the negative connecting wire 22 via the transistor circuit 102, the PhotoMOS relay 104, and the leak resistor 106.

In step S20, the microcomputer 200 detects, by the response waveform detecting portion 202, the response waveforms for the positive pulse signal and the negative pulse signal output in step S10 as a positive response waveform and a negative response waveform. At this time, the positive response waveform is input to the A/D converter 210 from the positive connecting wire 21 via the voltage-dividing resistor portions 301 and the operational amplifier 303 and is detected in the response waveform detecting portion 202. Moreover, the negative response waveform is input to the A/D converter 210 from the negative connecting wire 22 via the voltage-dividing resistor portions 302 and the operational amplifier 304 and is detected in the response waveform detecting portion 202.

In step S30, the microcomputer 200 calculates, by the amplitude ratio calculating portion 203, the amplitude Vap of the positive response waveform and the amplitude Van of the negative response waveform from the positive response waveform and the negative response waveform detected in step S20. For example, in the predetermined periods' worth positive response waveforms and negative response waveforms detected in step S20, by determining the amplitude in each period and calculating an average value thereof, it is possible to calculate the amplitude Vap of the positive response waveform and the amplitude Van of the negative response waveform. At this time, based on the ON/OFF timing in the positive pulse signal and the negative pulse signal output in step S10, ON/OFF timing in the positive response waveform and the negative response waveform may be determined.

In step S40, the microcomputer 200 calculates, by the amplitude ratio calculating portion 203, a difference V1 between the maximal value (maximum value) of the positive response waveform and the maximal value (maximum value) of the negative response waveform and a difference V2 between the minimal value (minimum value) of the positive response waveform and the minimal value (minimum value) of the negative response waveform based on the positive response waveform and the negative response waveform detected in step S20. For example, in the predetermined periods' worth positive response waveforms and negative response waveforms detected in step S20, the maximal value and the minimal value of the positive response waveform in each period and the maximal value and the minimal value of the negative response waveform in each period are determined and differences between them are calculated for each period. Then, by calculating the average value of the calculated differences of the periods, it is possible to calculate the above-described differences V1 and V2.

Incidentally, step S30 and step S40 may be performed at the same time in a series of processes without being performed separately. For example, from the positive response waveform and the negative response waveform detected in step S20, the maximal value (maximum value) and the minimal value (minimum value) of the positive response waveform and the maximal value (maximum value) and the minimal value (minimum value) of the negative response waveform are determined. Then, the amplitude Vap of the positive response waveform is calculated from the difference between the maximal value (maximum value) and the minimal value (minimum value) of the positive response waveform, and the amplitude Van of the negative response waveform is calculated from the difference between the maximal value (maximum value) and the minimal value (minimum value) of the negative response waveform. Moreover, the difference V1 between the maximal value (maximum value) of the positive response waveform and the maximal value (maximum value) of the negative response waveform and the difference V2 between the minimal value (minimum value) of the positive response waveform and the minimal value (minimum value) of the negative response waveform are calculated. At this time, as is the case with steps S30 and S40 described above, the average value of each period may be calculated by using predetermined periods' worth positive response waveforms and negative response waveforms.

In step S50, the microcomputer 200 calculates, by the amplitude ratio calculating portion 203, the amplitude ratio Rv by using the above-described expression (1) based on the calculation results in steps S30 and S40.

In step S60, the microcomputer 200 compares, by the leak detecting portion 204, the amplitude ratio Rv calculated in step S50 with a predetermined threshold value Rth and determines whether or not the amplitude ratio Rv is less than the threshold value Rth. The threshold value Rth used for this determination is a value smaller than the amplitude ratio Rv during normal operation in which no leak occurs and is previously set in accordance with the response waveform observed when a leak occurs, the response waveform illustrated in FIGS. 4 and 5. As a result of the determination in step S60, if it is determined that the amplitude ratio Rv is less than the threshold value Rth, the procedure proceeds to step S70; otherwise, the leak detection processing described in the flowchart of FIG. 6 is ended.

In step S70, the microcomputer 200 detects, by the leak detecting portion 204, a leak between the batteries 1 and 2 and the chassis ground. Here, the positive side and the negative side of the batteries 1 and 2 are not differentiated from each other, and detection is performed on the assumption that a leak occurs between at least one of them and the chassis ground. Furthermore, at this time, a predetermined warning signal for notifying the user in the vehicle of the occurrence of a leak may be output. After step S70 is performed, the microcomputer 200 ends the leak detection processing described in the flowchart of FIG. 6.

According to the embodiment of the present invention described above, the following effects are obtained.

(1) In the microcomputer 200, the leak detection device 100 outputs, by the pulse signal outputting portion 201, predetermined pulse signals to the positive connecting wire 21 connected to the positive sides of the batteries 1 and 2 and to the negative connecting wire 22 connected to the negative sides of the batteries 1 and 2 (step S10). Then, the leak detection device 100 detects, by the response waveform detecting portion 202, a positive response waveform for the positive pulse signal output to the positive connecting wire 21 and a negative response waveform for the negative pulse signal output to the negative connecting wire 22 (step S20). The leak detection device 100 calculates, by the amplitude ratio calculating portion 203, an amplitude ratio based on this positive response waveform and negative response waveform (step S50), and detects, by the leak detecting portion 204, a leak between the batteries 1 and 2 and the chassis ground based on the calculated amplitude ratio (steps S60 and S70). By doing so, even when the battery voltage varies, it is possible to detect the presence or absence of a leak correctly.

(2) The amplitude ratio calculating portion 203 calculates, in step S50, the amplitude ratio Rv by the above-described expression (1) based on the amplitude Vap of the positive response waveform and the amplitude Van of the negative response waveform calculated in step S30 and the difference V1 between the maximal value of the positive response waveform and the maximal value of the negative response waveform and the difference V2 between the minimal value of the positive response waveform and the minimal value of the negative response waveform, the differences V1 and V2 calculated in step S40. By doing so, from the positive response waveform and the negative response waveform, it is possible to calculate the amplitude ratio in accordance with the leak state between the batteries 1 and 2 and the chassis ground.

(3) The leak detecting portion 204 determines whether or not the amplitude ratio Rv is less than the predetermined threshold value Rth in step S60, and, when the amplitude ratio Rv becomes less than the threshold value Rth, in step S70, the leak detecting portion 204 detects a leak between at least one of the positive and negative sides of the batteries 1 and 2 and the chassis ground. By doing so, it is possible to detect the occurrence of a leak easily and reliably.

(4) The leak detection device 100 includes the PhotoMOS relays 103 and 104 as insulating circuits that provide insulation between the positive connecting wire 21 and the pulse signal outputting portion 201 and between the negative connecting wire 22 and the pulse signal outputting portion 201. The pulse signal outputting portion 201 outputs pulse signals to the positive connecting wire 21 and the negative connecting wire 22 via the PhotoMOS relays 103 and 104, respectively. By doing so, irrespective of the potential difference between the microcomputer 200 having the pulse signal outputting portion 201 and the positive connecting wire 21 and the negative connecting wire 22, it is possible to output the pulse signals to the positive connecting wire 21 and the negative connecting wire 22 from the pulse signal outputting portion 201. Furthermore, since the insulating circuits are configured by using the PhotoMOS relays 103 and 104, even when the high-voltage batteries 1 and 2 are used, it is possible to provide proper insulation between the positive connecting wire 21 and the pulse signal outputting portion 201 and between the negative connecting wire 22 and the pulse signal outputting portion 201.

(5) The leak detection device 100 includes the voltage-dividing resistor portions 301 and 302 that divide the voltage of the positive connecting wire 21 and the voltage of the negative connecting wire 22, respectively. The response waveform detecting portion 202 detects the positive response waveform and the negative response waveform via the voltage-dividing resistor portions 301 and 302. By doing so, it is possible to detect the positive response waveform and the negative response waveform within an appropriate voltage range.

(Second Embodiment)

Next, a second embodiment of the present invention will be described. In the above-described first embodiment, the leak detection device that detects a leak based on the response waveform observed when the pulse signals are input to the positive and negative sides of the connecting wires between the batteries and the chassis ground has been described. On the other hand, in the second embodiment which will be described below, a leak detection device that performs detection of the state of an insulating circuit used for input of a pulse signal in addition to leak detection similar to that described in the first embodiment will be described.

FIG. 7 is a diagram depicting the configuration of a leak detection device 100a according to this embodiment. The leak detection device 100a depicted in FIG. 7 differs from the leak detection device 100 according to the first embodiment depicted in FIG. 2 in that a monitor waveform detecting portion 205 and an insulation diagnosing portion 206 are further provided in the microcomputer 200 and voltage-dividing circuits 107 and 108 are connected to the PhotoMOS relays 103 and 104, respectively. Incidentally, a power supply device including this leak detection device 100a has the same configuration as the power supply device depicted in FIG. 1, the power supply device including the leak detection device 100.

The voltage-dividing circuits 107 and 108 are connected between the PhotoMOSFETs on the output sides of the PhotoMOS relays 103 and 104 and the control ground, respectively. Then, the voltage-dividing circuits 107 and 108 divide the output voltages of the PhotoMOS relays 103 and 104 at the time of output of the positive pulse signal and the negative pulse signal to the positive connecting wire 21 and the negative connecting wire 22 from the pulse signal outputting portion 201 via the PhotoMOS relays 103 and 104, respectively, at predetermined voltage-dividing ratios and output the resultant voltages. The waveforms of these output voltages are output to the monitor waveform detecting portion 205 of the microcomputer 200 from the voltage-dividing circuits 107 and 108 as a positive monitor waveform and a negative monitor waveform.

The monitor waveform detecting portion 205 incorporates an A/D converter 211 and takes in the positive monitor waveform and the negative monitor waveform input from the voltage-dividing circuits 107 and 108 as digital values, respectively, by using this A/D converter 211. As a result, in the monitor waveform detecting portion 205, it is possible to detect the positive monitor waveform and the negative monitor waveform at the time of output of the positive pulse signal and the negative pulse signal.

The insulation diagnosing portion 206 makes a diagnosis as to whether the states of the PhotoMOS relays 103 and 104 are normal or abnormal states such as a short-circuit state and an open state based on the positive monitor waveform and the negative monitor waveform detected by the monitor waveform detecting portion 205. Incidentally, a specific method for making a diagnosis of the states of the PhotoMOS relays 103 and 104 by the insulation diagnosing portion 206 will be described in detail later.

Here, monitor waveforms which will be detected when the PhotoMOS relays 103 and 104 are brought into a short-circuit state will be described. For example, if the PhotoMOS relay 103 is brought into a short-circuit state due to a breakdown or the like, irrespective of the presence or absence of an output of the positive pulse signal from the pulse signal outputting portion 201, the state enters a state in which the positive connecting wire 21 and the negative connecting wire 22 are always connected to the control ground. In this case, even when a leak does not occur between the batteries 1 and 2 and the chassis ground, since a response waveform similar to the response waveform observed at the time of the occurrence of a leak is detected in the response waveform detecting portion 202, it becomes impossible to determine the presence or absence of the occurrence of a leak based on the response waveform.

Specific examples of the above-described situation are depicted in FIGS. 8 and 9. FIG. 8 is a diagram depicting an example of a response waveform observed when a leak occurs on the positive side in a normal state of the PhotoMOS relay 103. On the other hand, FIG. 9 is a diagram depicting an example of a response waveform observed when no leak occurs in a short-circuit state of the PhotoMOS relay 103. These diagrams reveal that, when the PhotoMOS relay 103 is in a short-circuit state, a response waveform similar to the response waveform observed when a leak occurs is detected. Incidentally, FIG. 10 is a diagram depicting an example of a response waveform observed when no leak occurs in a normal state of the PhotoMOS relay 103, and is similar to the response waveform observed when no leak occurs in the first embodiment depicted in FIG. 3.

The same goes for the negative side; when the PhotoMOS relay 104 is brought into a short-circuit state due to a breakdown or the like, irrespective of the presence or absence of an output of a negative pulse signal from the pulse signal outputting portion 201, the state enters a state in which the positive connecting wire 21 and the negative connecting wire 22 are always connected to the control ground. In this case, even when a leak does not occur between the batteries 1 and 2 and the chassis ground, since a response waveform similar to the response waveform observed at the time of the occurrence of a leak is detected in the response waveform detecting portion 202, it becomes impossible to determine the presence or absence of the occurrence of a leak based on the response waveform.

To solve the above-described problem, in this embodiment, the positive monitor waveform and the negative monitor waveform output from the voltage-dividing circuits 107 and 108 are detected by the monitor waveform detecting portion 205, and a diagnosis as to whether or not the PhotoMOS relays 103 and 104 which are insulating circuits are in the normal state is made by the insulation diagnosing portion 206 based on these waveforms. Use of this diagnosis result with the result of detection of the leak state based on the response waveform described in the first embodiment makes it possible to detect the presence or absence of a leak in the positive connecting wire 21 and the negative connecting wire 22 correctly.

An example of a monitor waveform which is detected by the monitor waveform detecting portion 205 will be described. FIG. 11 is a diagram depicting an example of a monitor waveform observed when the PhotoMOS relay 103 on the positive side is short-circuited, and FIG. 12 is a diagram depicting an example of a monitor waveform observed when the PhotoMOS relay 104 on the negative side is short-circuited. On the other hand, FIG. 13 is a diagram depicting an example of a monitor waveform observed when the PhotoMOS relays 103 and 104 are normal.

In the monitor waveforms of FIGS. 11 to 13, the waveform indicated by a solid line represents a positive monitor waveform in response to ON/OFF of a positive pulse signal, and the waveform indicated by a broken line represents a negative monitor waveform in response to ON/OFF of a negative pulse signal. Incidentally, in FIGS. 11 to 13, "ON" and "OFF" depicted in an upper stage indicate ON/OFF timing of a positive pulse signal, and "ON" and "OFF" depicted in a lower stage indicate ON/OFF timing of a negative pulse signal. As described above, when a monitor waveform is detected in the monitor waveform detecting portion 205, a positive pulse signal and a negative pulse signal are alternately output from the pulse signal outputting portion 201. That is, the positive pulse signal and the negative pulse signal are made to be alternately turned on by shifting the ON/OFF timing of the positive pulse signal and the negative pulse signal.

In the monitor waveforms of FIGS. 11 to 13, in the vicinity of 8 sec. and in the vicinity of 10 sec., the positive pulse signal is switched from ON to OFF and the negative pulse signal is switched from OFF to ON. The timing immediately before this, that is, the timing corresponding to the falling start point of the positive pulse signal and the rising start point of the negative pulse signal is hereinafter referred to as a first reference point. In FIGS. 11 to 13, $Vmp1$ and $Vmn1$ represent the voltages of the positive monitor waveform and the negative monitor waveform, respectively, at the first reference point.

Moreover, in the vicinity of 9 sec., the positive pulse signal is switched from OFF to ON, and the negative pulse signal is switched from ON to OFF. The timing immediately before this, that is, the timing corresponding to the rising start point of the positive pulse signal and the falling start point of the negative pulse signal is hereinafter referred to as a second reference point. In FIGS. 11 to 13, $Vmp2$ and $Vmn2$ represent the positive monitor waveform and the negative monitor waveform, respectively, at the second reference point.

The insulation diagnosing portion 206 calculates a voltage difference $Vm1$ between the positive monitor waveform and the negative monitor waveform at the first reference point by the following expression (2) based on the voltages $Vmp1$ and $Vmn1$ depicted in the monitor waveforms of FIGS. 11 to 13.

$$Vm1 = Vmp1 - Vmn1 \tag{2}$$

Moreover, a voltage difference $Vm2$ between the positive monitor waveform and the negative monitor waveform at the second reference point is calculated by the following expression (3) based on the voltages $Vmp2$ and $Vmn2$ depicted in the monitor waveforms of FIGS. 11 to 13.

$$Vm2 = Vmp2 - Vmn2 \tag{3}$$

Furthermore, by the following expression (4), a voltage difference $Vd$ at the rising start point of the positive monitor waveform and the negative monitor waveform is calculated.

$$Vd = Vmp2 - Vmn1 \tag{4}$$

The insulation diagnosing portion 206 calculates indexes for making a diagnosis as to whether or not the PhotoMOS relays 103 and 104 are in a normal state based on the voltage differences determined by the above-described expressions (2) to (4). Specifically, based on the voltage differences $Vm1$, $Vm2$, and $Vd$ of the expressions (2) to (4) and the difference $V1$ between the maximal value of the positive response waveform and the maximal value of the negative response waveform and the difference $V2$ between the minimal value of the positive response waveform and the minimal value of the negative response waveform described in the above-described first embodiment, by the following expressions (5) to (7), a first monitor ratio $Am1$, a second monitor ratio $Am2$, and a monitor difference ratio $Ad$ as diagnosis indexes are calculated.

$$\begin{aligned}Am1 &= 2Vm1/(V1+V2) \\ &= 2(Vmp1-Vmn1)/(V1+V2)\end{aligned} \tag{5}$$

$$\begin{aligned}Am2 &= 2Vm2/(V1+V2) \\ &= 2(Vmp2-Vmn2)/(V1+V2)\end{aligned} \tag{6}$$

$$\begin{aligned}Ad &= 2Vd/(V1+V2) \\ &= 2(Vmp2-Vmn1)/(V1+V2)\end{aligned} \tag{7}$$

After calculating the first monitor ratio $Am1$, the second monitor ratio $Am2$, and the monitor difference ratio $Ad$ in the manner described above, the insulation diagnosing portion 206 makes a diagnosis of the states of the PhotoMOS relays 103 and 104 by comparing these diagnosis indexes with predetermined threshold values. For example, if the second monitor ratio Am2 and the monitor difference ratio Ad satisfy the following conditional expression (8), the insulation diagnosing portion 206 determines that the PhotoMOS relay 103 is short-circuited. Incidentally, in the conditional expression (8), Tha and Thb are threshold values which are previously set as data set values of software.

$$Am2 \geq Tha \text{ and } Ad \geq Thb \quad (8)$$

Moreover, if the first monitor ratio Am1 and the monitor difference ratio Ad satisfy the following conditional expression (9), the insulation diagnosing portion 206 determines that the PhotoMOS relay 104 is short-circuited. Incidentally, in the conditional expression (9), The and Thd are threshold values which are previously set as data set values of software. The values of these threshold values Thc and Thd may be the same as or different from the threshold values Tha and Thb in the conditional expression (8) described above.

$$Am1 \geq Thc \text{ and } Ad \geq Thd \quad (9)$$

Furthermore, if the first monitor ratio Am1 and the second monitor ratio Am2 and the amplitude ratio Rv determined by the expression (1) described in the first embodiment satisfy the following conditional expression (10), the insulation diagnosing portion 206 determines that at least one of the PhotoMOS relays 103 and 104 is in an open state and the positive pulse signal or the negative pulse signal is interrupted in the PhotoMOS relay 103 or 104. Incidentally, in the conditional expression (10), The, Thf, and Thg are threshold values which are previously set as data set values of software. The values of these threshold values The, Thf, and Thg may be the same as or different from the threshold values Tha and Thb in the conditional expression (8) described above and the threshold values Thc and Thd in the conditional expression (9) described above.

$$Am1 \leq The \text{ and } Am2 \leq Thf \text{ and } Rv \leq Thg \quad (10)$$

FIG. 14 is a flowchart depicting the flow of leak and relay state detection processing which is performed in the microcomputer 200 when the presence or absence of a leak is detected and a diagnosis of the states of the PhotoMOS relays 103 and 104 is made in the manner described above. Incidentally, in FIG. 14, portions performing the same processing as the leak detection processing of the first embodiment depicted in FIG. 6 are identified with the same step numbers as those of FIG. 6.

In steps S10 to S70, the microcomputer 200 performs leak detection processing by performing the processing similar to that of FIG. 6.

In step S80, the microcomputer 200 detects, by the monitor waveform detecting portion 205, the output voltage waveforms of the PhotoMOS relays 103 and 104 observed when the positive pulse signal and the negative pulse signal are output in step S10 as a positive monitor waveform and a negative monitor waveform. At this time, the positive monitor waveform is input to the A/D converter 211 via the voltage-dividing circuit 107 from the PhotoMOS relay 103 and is detected in the monitor waveform detecting portion 205. Moreover, the negative monitor waveform is input to the A/D converter 211 via the voltage-dividing circuit 108 from the PhotoMOS relay 104 and is detected in the monitor waveform detecting portion 205.

In step S90, the microcomputer 200 determines, by the insulation diagnosing portion 206, the voltage Vmp1 of the positive monitor waveform and the voltage Vmn1 of the negative monitor waveform at the above-described first reference point and the voltage Vmp2 of the positive monitor waveform and the voltage Vmn2 of the negative monitor waveform at the second reference point from the positive monitor waveform and the negative monitor waveform detected in step S80. Then, based on these voltages, the microcomputer 200 calculates the voltage difference Vm1 between the positive monitor waveform and the negative monitor waveform at the first reference point, the voltage difference Vm2 between the positive monitor waveform and the negative monitor waveform at the second reference point, and the voltage difference Vd at the rising start point of the positive monitor waveform and the negative monitor waveform by using the above-described expressions (2) to (4).

In step S100, the microcomputer 200 calculates, by the insulation diagnosing portion 206, the first monitor ratio Am1, the second monitor ratio Am2, and the monitor difference ratio Ad by the above-described expressions (5) to (7) based on the voltage differences Vm1, Vm2, and Vd calculated in step S90 and the differences V1 and V2 calculated in step S40.

In step S110, the microcomputer 200 determines, by the insulation diagnosing portion 206, whether or not the second monitor ratio Am2 and the monitor difference ratio Ad calculated in step S100 satisfy the conditional expression (8) described above by comparing the second monitor ratio Am2 and the monitor difference ratio Ad with the predetermined threshold values Tha and Thb, respectively. As a result, if the second monitor ratio Am2 and the monitor difference ratio Ad satisfy the conditional expression (8), the procedure proceeds to step S120; if the second monitor ratio Am2 and the monitor difference ratio Ad do not satisfy the conditional expression (8), the procedure proceeds to step S130.

In step S120, the microcomputer 200 determines, by the insulation diagnosing portion 206, that the PhotoMOS relay 103 between the positive connecting wire 21 and the pulse signal outputting portion 201 is short-circuited and detects a short-circuit in the PhotoMOS relay 103. At this time, a predetermined warning signal or the like may be output to notify the user in the vehicle that the PhotoMOS relay 103 is short-circuited.

In step S130, the microcomputer 200 determines, by the insulation diagnosing portion 206, whether or not the first monitor ratio Am1 and the monitor difference ratio Ad calculated in step S100 satisfy the conditional expression (9) described above by comparing the first monitor ratio Am1 and the monitor difference ratio Ad with the predetermined threshold values Thc and Thd, respectively. As a result, if the first monitor ratio Am1 and the monitor difference ratio Ad satisfy the conditional expression (9), the procedure proceeds to step S140; if the first monitor ratio Am1 and the monitor difference ratio Ad do not satisfy the conditional expression (9), the procedure proceeds to step S150.

In step S140, the microcomputer 200 determines, by the insulation diagnosing portion 206, that the PhotoMOS relay 104 between the negative connecting wire 22 and the pulse signal outputting portion 201 is short-circuited and detects a short-circuit in the PhotoMOS relay 104. At this time, a predetermined warning signal or the like may be output to notify the user in the vehicle that the PhotoMOS relay 104 is short-circuited.

In step S150, the microcomputer 200 determines, by the insulation diagnosing portion 206, whether or not the first monitor ratio Am1 and the first monitor ratio Am1 calculated in step S100 and the amplitude ratio Rv calculated in step S50 satisfy the conditional expression (10) described above by comparing the first monitor ratio Am1, the second monitor ratio Am2, and the amplitude ratio Rv with the predetermined threshold values Thc, Thf, and Thg, respectively. As a result, if the first monitor ratio Am1, the first monitor ratio Am1, and the amplitude ratio Rv satisfy the conditional expression (10), the procedure proceeds to step S160; if the first monitor ratio Am1, the first monitor ratio Am1, and the amplitude ratio Rv do not satisfy the conditional expression (10), the processing described in the flowchart of FIG. 14 is ended.

In step S160, the microcomputer 200 determines, by the insulation diagnosing portion 206, that at least one of the PhotoMOS relays 103 and 104 interrupts a pulse signal from the pulse signal outputting portion 201 and detects that these relays are in an open state. At this time, a predetermined warning signal or the like may be output to notify the user in the vehicle that the PhotoMOS relay 103 or 104 is in an open state. After performing step S160, the microcomputer 200 ends the processing described in the flowchart of FIG. 14.

According to the above-described second embodiment of the present invention, in addition to the effects of (1) to (5) described in the first embodiment, the following effects are further obtained.

(6) The leak detection device 100a includes the monitor waveform detecting portion 205 and the insulation diagnosing portion 206 in the microcomputer 200. The monitor waveform detecting portion 205 detects, as a positive monitor waveform and a negative monitor waveform, the output voltage waveforms of the PhotoMOS relays 103 and 104 observed when the pulse signals are output to the positive connecting wire 21 and the negative connecting wire 22 via the PhotoMOS relays 103 and 104 as the insulating circuits from the pulse signal outputting portion 201 (step S80). The insulation diagnosing portion 206 makes a diagnosis of the states of the PhotoMOS relays 103 and 104 based on the positive monitor waveform and the negative monitor waveform detected by the monitor waveform detecting portion 205 (steps S90 to S160). By doing so, it is possible to detect the presence or absence of a leak in the positive connecting wire 21 and the negative connecting wire 22 with consideration given to the states of the PhotoMOS relays 103 and 104.

(7) The pulse signal outputting portion 201 alternately outputs a positive pulse signal to the positive connecting wire 21 and a negative pulse signal to the negative connecting wire 22. Based on the positive monitor waveform and the negative monitor waveform detected by the monitor waveform detecting portion 205 while these pulse signals are being output, the insulation diagnosing portion 206 calculates, in step S90, the voltage Vmp1 of the positive monitor waveform and the voltage Vmn1 of the negative monitor waveform at the first reference point corresponding to the falling start point of the positive pulse signal and the rising start point of the negative pulse signal and the voltage Vmp2 of the positive monitor waveform and the voltage Vmn2 of the negative monitor waveform at the second reference point corresponding to the rising start point of the positive pulse signal and the falling start point of the negative pulse signal. Then, based on these voltages thus calculated and the difference V1 between the maximal value of the positive response waveform and the maximal value of the negative response waveform and the difference V2 between the minimal value of the positive response waveform and the minimal value of the negative response waveform calculated in step S40, by the expressions (5) to (7) described above, the first monitor ratio Am1, the second monitor ratio Am2, and the monitor difference ratio Ad are calculated. In steps S110 to S160, based on the first monitor ratio Am1, the second monitor ratio Am2, and the monitor difference ratio Ad thus calculated, a diagnosis of the states of the PhotoMOS relays 103 and 104 is made. By doing so, it is possible to make a diagnosis of the states of the PhotoMOS relays 103 and 104 accurately.

(8) The insulation diagnosing portion 206 determines that the PhotoMOS relay 103 between the positive connecting wire 21 and the pulse signal outputting portion 201 is short-circuited when the second monitor ratio Am2 is more than or equal to the predetermined threshold value Tha and the monitor difference ratio Ad becomes more than or equal to the predetermined threshold value Thb in steps S110 and S120. Moreover, the insulation diagnosing portion 206 determines that the PhotoMOS relay 104 between the negative connecting wire 22 and the pulse signal outputting portion 201 is short-circuited when the first monitor ratio Am1 is more than or equal to the predetermined threshold value Thc and the monitor difference ratio Ad becomes more than or equal to the predetermined threshold value Thd in steps S130 and S140. By doing so, it is possible to determine reliably whether or not the PhotoMOS relays 103 and 104 are short-circuited.

(9) The insulation diagnosing portion 206 determines that the PhotoMOS relay 103 or 104 interrupts the pulse signal when both the first monitor ratio Am1 and the second monitor ratio Am2 are less than or equal to the predetermined threshold values The and Thf and the amplitude ratio Rv calculated by the amplitude ratio calculating portion 203 becomes less than or equal to the predetermined threshold value Thg in steps S150 and S160. By doing so, it is possible to determine reliably whether or not the PhotoMOS relays 103 and 104 are in an open state.

(10) The leak detection device 100a further includes the voltage-dividing circuits 107 and 108 connected to the output sides of the PhotoMOS relays 103 and 104. The monitor waveform detecting portion 205 detects the positive monitor waveform and the negative monitor waveform via the voltage-dividing circuits 107 and 108. By doing so, it is possible to detect the positive monitor waveform and the negative monitor waveform within an appropriate voltage range in the monitor waveform detecting portion 205.

Incidentally, in the second embodiment described above, an example in which the amplitude ratio Rv is calculated in the manner similar to the first embodiment and a leak between the batteries 1 and 2 and the chassis ground is detected based on this amplitude ratio Rv and a diagnosis of the states of the PhotoMOS relays 103 and 104 which are insulating circuits is made has been described. However, a method for making a diagnosis of an insulating circuit according to the present invention can also be applied to a case in which leak detection is performed without calculation of an amplitude ratio. For example, also in a leak detection device that inputs pulse signals to a positive connecting wire and a negative connecting wire via insulating circuits and performs leak detection based on shape variations in response waveforms for the pulse signals, it is possible to make a diagnosis of the states of the insulating circuits by applying the method for making a diagnosis of an insulating circuit, the method described in the second embodiment, to the leak detection device.

Incidentally, in the first and second embodiments described above, an example in which insulation is provided between the positive connecting wire 21 and the pulse signal outputting portion 201 and between the negative connecting wire 22 and the pulse signal outputting portion 201 by using the PhotoMOS relays 103 and 104 as insulating circuits has been described. However, other elements such as a photocoupler and a transformer may be used as insulating circuits. An appropriate element can be used as an insulating circuit depending on the period of a pulse signal output from the pulse signal outputting portion 201, the voltages of the batteries 1 and 2, and so forth.

The embodiments and various modified examples described above are mere examples, and the present invention is not limited to the contents of these embodiments and examples as long as the feature of the invention is not impaired.

The invention claimed is:

1. A leak detection device that improves detection of a presence or absence of a leak between a battery and a ground, the leak detection device comprising:
a first transistor that outputs predetermined positive pulse signals to a positive connecting wire connected to a positive side of the battery;
a second transistor that outputs predetermined negative pulse signals to a negative connecting wire connected to a negative side of the battery;
an analog to digital converter that:
detects a positive response waveform for the predetermined positive pulse signal output to the positive connecting wire,
detects a negative response waveform for the pulse signal output to the negative connecting wire,
outputs first digital values for the positive response waveform, and
outputs second digital values for the negative response waveform;
a microcomputer communicatively coupled to the analog to digital converter, wherein the microcomputer:
receives the first digital value and the second digital values from the analog to digital converter,
determines an amplitude Vap of the positive waveform from the first digital values,
determines an amplitude Van of the negative waveform from the second digital values,
calculates a first difference V1 between a maximal value of the first digital values and a maximal value of the second digital values,
calculates a difference V2 between a minimal value of the digital values and a minimal value of the second digital values,
calculates an amplitude ratio Rv according to:

$$Rv=(Vap+Van)/(V1+V2);$$

detects the leak between the battery and the ground based on the amplitude ratio Rv.

2. The leak detection device according to claim 1, wherein the leak is detected when the amplitude ratio Rv becomes less than a predetermined threshold value.

3. The leak detection device according to claim 1, further comprising:
a voltage-dividing resistor circuit that divide voltages of the positive connecting wire and the negative connecting wire,
wherein
the analog to digital converter detects the positive response waveform and the negative response waveform via the voltage dividing circuit.

4. The leak detection device according to claim 1, further comprising:
insulating circuits that provide insulation between the positive connecting wire and the first transistor and between the negative connecting wire and the second transistor.

5. The leak detection device according to claim 4, wherein the insulating circuits include optically isolating relays.

6. The leak detection device according to claim 4, wherein the microcomputer further:
makes a diagnosis of states of the insulating circuits based on the positive response waveform and the negative response waveform.

7. The leak detection device according to claim 6, wherein the first transistor and the second transistor alternately output the predetermined positive pulse signals and the predetermined negative pulse signals, and
the microcomputer further:
calculates a first monitor ratio Am1, a second monitor ratio Am2, and a monitor difference ratio Ad based on a voltage Vmp1 of the positive response waveform and a voltage Vmn1 of the negative response waveform at a first reference point corresponding to a falling start point of the predetermined positive pulse signals and a rising start point of the predetermined negative pulse signals, a voltage Vmp2 of the positive response waveform and a voltage Vmn2 of the negative response waveform at a second reference point corresponding to a rising start point of the predetermined positive pulse signals and a falling start point of the predetermined negative pulse signals, according to:

$$AM1=2(Vmp1-Vmn1)/(V1+V2)$$

$$AM2=2(Vmp2-Vmn2)/(V1+V2)$$

$$Ad=2(Vmp2-Vmn1)/(V1+V2),$$

and the diagnosis of states of the insulating circuits is determined based on the first monitor ratio Am1, second monitor ratio Am2, and monitor difference ratio Ad.

8. The leak detection device according to claim 7, wherein when the second monitor ratio Am2 is more than or equal to a predetermined threshold value and the monitor difference ratio Ad becomes more than or equal to a predetermined threshold value, the microcomputer determines that one the insulating circuits between the positive connecting wire and the pulse signal outputting portion is short-circuited, and
when the first monitor ratio Am1 is more than or equal to a predetermined threshold value and the monitor difference ratio Ad becomes more than or equal to a predetermined threshold value, the microcomputer determines that one of the insulating circuits between the negative connecting wire and the pulse signal outputting portion is short-circuited.

9. The leak detection device according to claim 8, wherein the microcomputer determines that the insulating circuits interrupt the positive pulse signal and the negative pulse signal when both the first monitor ratio Am1 and the second monitor ratio Am2 are less than or equal to predetermined threshold values and the amplitude ratio calculated by the amplitude ratio calculating portion becomes less than or equal to a predetermined threshold value.

10. The leak detection device according to claim 6, further comprising:
a voltage-dividing circuit connected to output sides of the insulating circuits,
wherein
the microcomputer further detects the positive response waveform and the negative response waveform via the voltage-dividing circuits.

11. A leak detection device that improves detection of a presence or absence of a leak between a battery and a ground, the leak detection device comprising:
- a first transistor that outputs predetermined positive pulse signals to a positive connecting wire connected to a positive side of the battery;
- a second transistor that outputs predetermined negative pulse signals to a negative connecting wire connected to a negative side of the battery, wherein the first transistor and the second transistor alternately output the predetermined positive pulse signals and the predetermined negative pulse signals;
- insulating circuits that provide insulation between the positive connecting wire and the first transistor and between the negative connecting wire and the second transistor;
- an analog to digital converter that:
  - detects a positive response waveform for the predetermined positive pulse signals output to the positive connecting wire,
  - detects a negative response waveform for the predetermined negative pulse signals output to the negative connecting wire,
  - outputs first digital values for the positive response waveform, and
  - outputs second digital values for the negative response waveform;
- a microcomputer communicatively coupled to the analog to digital converter, wherein the microcomputer:
- receives the first digital value and the second digital values from the analog to digital converter,
- determines a voltage Vmp1 of the positive waveform from the first digital values at a first reference point corresponding to a falling start point of the positive pulse signals and a rising start point of the negative pulse signals,
- determines a voltage Vmn1 of the negative waveform from the second digital values at the first reference point,
- determines a voltage Vmp2 of the positive waveform from the first digital values at a second reference point corresponding to a rising start point of the positive pulse signals and a falling start point of the negative pulse signals,
- determines a voltage Vmn2 of the negative waveform from the second digital values at the second reference point,
- calculates a first difference V1 between a maximal value of the first digital values and a maximal value of the second digital values,
- calculates a difference V2 between a minimal value of the digital values and a minimal value of the second digital values,
- calculates a first monitor ratio Am1, a second monitor ratio Am2, and a monitor difference ratio Ad according to:

$$AM1=2(Vmp1-Vmn1)/(V1+V2)$$

$$Am2=2(Vmp2-Vmn2)/(V1+V2)$$

$$Ad=2(Vmp2-Vmn1)/(V1+V2),$$

- determines a diagnosis of states of the insulating circuits based on the first monitor ratio Am1, second monitor ratio Am2, and monitor difference ratio Ad;
- detects the leak between the battery and the ground based on the positive response waveform and the negative response waveform.

12. The leak detection device according to claim 11, wherein
- when the second monitor ratio Am2 is more than or equal to a predetermined threshold value and the monitor difference ratio Ad becomes more than or equal to a predetermined threshold value, the microcomputer determines that the insulating circuit between the positive connecting wire and the pulse signal outputting portion is short-circuited, and
- when the first monitor ratio Am1 is more than or equal to a predetermined threshold value and the monitor difference ratio Ad becomes more than or equal to a predetermined threshold value, the microcomputer determines that the insulating circuit between the negative connecting wire and the pulse signal outputting portion is short-circuited.

13. The leak detection device according to claim 11, further comprising:
- voltage-dividing circuits connected to output sides of the insulating circuits,
wherein
- the analog to digital converter detects the positive monitor waveform and the negative monitor waveform via the voltage-dividing circuits.

* * * * *